United States Patent [19]
McAllister et al.

[11] Patent Number: 5,747,095
[45] Date of Patent: May 5, 1998

[54] METHOD FOR REPAIRING DEFECTIVE ELECTRICAL CONNECTIONS ON MULTI-LAYER THIN FILM (MLTF) ELECTRONIC PACKAGES

[75] Inventors: Michael McAllister, Clintondale; Eric Daniel Perfecto, Poughkeepsie; James McDonald, Newburgh, all of N.Y.; Keshav Prasad, San Jose, Calif.; Gordon J. Robbins, Austin, Tex.; Chandrika Prasad, Wappingers Falls, N.Y.; Madhavan Swaminathan; George Eugene White, both of Marietta, Ga.

[73] Assignee: International Business Machines Corporation, Armonk, N.Y.

[21] Appl. No.: 800,945

[22] Filed: Feb. 14, 1997

Related U.S. Application Data

[62] Division of Ser. No. 577,677, Dec. 21, 1995.

[51] Int. Cl.[6] ............................................ B05D 5/12
[52] U.S. Cl. ........................... 427/8; 427/96; 427/123; 427/261; 427/282; 427/404
[58] Field of Search ................................ 427/8, 96, 123, 427/404, 261, 282

[56] References Cited

U.S. PATENT DOCUMENTS

| | | | |
|---|---|---|---|
| 4,254,445 | 3/1981 | Ho | 361/392 |
| 4,480,288 | 10/1984 | Gazdik et al. | 361/398 |
| 4,489,364 | 12/1984 | Chance et al. | 361/395 |
| 5,220,490 | 6/1993 | Weigler et al. | 361/409 |
| 5,224,022 | 6/1993 | Weigler et al. | 361/409 |
| 5,243,140 | 9/1993 | Bhatla et al. | 174/254 |
| 5,258,236 | 11/1993 | Arjavalingam et al. | 428/626 |

OTHER PUBLICATIONS

*IBM Technical Disclosure Bulletin*, vol. 20, No. 9 Feb. 1978 C.W. Ho and C.Y. Ting, Planar Wiring Repair Technique for the Thin-Film Metal Package Via Solder Evaporation, vol. 20, No. 9, IBM Corp. 1978, pp. 3729–3730.

*Primary Examiner*—Bernard Pianalto
*Attorney, Agent, or Firm*—DeLio & Peterson LLC; John J. Tomaszewski; Aziz M. Ahsan

[57] ABSTRACT

A multi-layer thin film structure having defined repair lines thereon and a method for repairing interconnections in the multi-layer thin film structure (MLTF) and/or making engineering charges (EC) are provided. The method comprises determining any interconnection defects in the MLTF at a thin film layer adjacent the top metal layer of the structure, using lithography, e.g., direct write expose technology, to define the top surface connections needed to repair the interconnections and/or make EC's, and forming the top surface metallization and repair lines using additive or substractive metallization techniques.

10 Claims, 3 Drawing Sheets

METHOD FOR REPAIRING DEFECTIVE ELECTRICAL CONNECTIONS ON MULTI-LAYER THIN FILM (MLTF) ELECTRONIC PACKAGES

This is a divisional of copending application U.S. Ser. No. 08/577,677 filed on Dec. 21, 1995.

BACKGROUND OF THE INVENTION

1. Field of the Invention

This invention relates to multi-layer thin film (MLTF) structure containing electronic packages such as multi-chip modules (MCM) and, more particularly, to a method for making engineering changes (EC's) in the electronic structure and/or repairing defective electrical connections in the MLTF structure and to the resulting MLTF structure and electronic component fabricated by the repair method.

2. Description of Related Art

Thin film electronic components offer an attractive packaging solution for high performance and light weight systems such as in computer, telecommunication, military and consumer applications. With the Semiconductor Industry Association (SIA) predicting clock frequencies in the range 200 MHz–1 GHz in the year 2000, the use for thin film packaging will continue to increase. Though thin films offer high density interconnections, the manufacturing process typically produces some number of non-working interconnections due to process induced defects and a resulting low component product output yield. To assure the quality and reliability of the product, the defective interconnections need to be repaired to ensure their functionality, so as to assure a fault free electronic package.

Package interconnections consist of multiple layers of interconnections which are used to interconnect various parts of the system. After all the layers of the MLTF are fabricated, a final test is performed from the top surface of the package to separate defective interconnects from defect-free interconnects to guarantee the functionality of the interconnects and the package. Since a fully functioning package cannot support any defective interconnects, the package must either be thrown away, which is not feasible for thin film packages due to the high cost involved, or the defective interconnects can be repaired. The repair option accordingly represents an attractive solution for thin film packages.

In the past, repair schemes such as Direct Distribution Engineering Change (DDEC) as shown in U.S. Pat. No. 5,243,140 has been used whereby a series of 'add' and 'delete' repair operations have been used on a fixed metal layout on the top surface of the MLTF structure. In general, the repair scheme utilizes two correction pads arranged in an array, at least two direct distribution structures, a signal pad and a conductor extending between at least two direct distribution structures. This method typically creates problems due to congestion on the top surface of the package and resulting stubs between a pad and its corresponding via which can act as a bottleneck for high performance products.

In U.S. Pat. No. 4,254,445 a module for LSI chips includes an orthogonal array of sets of pads and fan-out metallization for a large number of chips. Running parallel to the sides of the chips and the fan-out area are several parallel prefabricated, thin film engineering change (EC) interconnection lines terminating in pads adjacent to the fan-out. The pads are arranged to permit discretionary connections of the fan-outs to the EC pads with minimal crossovers by means of short fly wires.

U.S. Pat. No. 4,489,364 shows a chip carrying module including a number of EC change lines buried below the surface of the module. The EC lines are interrupted periodically to provide a set of vias extending up to the upper surface of the module between each set of chips where the vias are connected by dumbbell-shaped pads including a narrow link which permits laser deletion. The fan-out pads can be connected to the pads by means of fly-wires.

U.S. Pat. Nos. 5,220,490 and 5,224,022 show custom interconnections done by personalizing (not repairing) the top metal wiring. The customizable circuit has a high density of orthogonally placed X and Y conductors capable of interconnecting closely spaced LSI circuits.

The above patents are incorporated herein by reference.

A typical thin film structure containing a number of interconnections using vias, pads and connecting conductor straps is shown in cross-section FIG. 1 as numeral 10. The structure is typically mounted on a substrate (not shown) such as a ceramic material (MCM-D/C) containing wiring. The MLTF structure consists of a power plane (brick) or capture level 19, mesh 1 level 11, X wiring layer 12, Y wiring layer 13, ground plane mesh 2 layer 14 and a top surface metallurgy level (TSM) 15. The top surface metallurgy (TSM) level contains the vias 16, corresponding pads 17 and via-pad connector 18 for connecting chips to the thin film package. The top surface metallurgy level would also contain the repair wires for correcting faulty interconnections or making EC's.

FIG. 2, which represents a partial top view of a typical MCM and of the TSM metallization level 15 of FIG. 1 shows one chip area bounded by the dotted lines 27, vias 16 and pads 17 (as chip connection pads such as controlled collapse chip connection pads known as C4 pads) with the vias representing connections to the I/O in the MLTF structure and supporting substrate if any and the C4 pads represent the microsockets supporting the C4 balls connecting the chip to the thin film substrate. As can be seen from the figure, the C4 pads are offset from the vias, which is preferable in high performance machines to ensure the elimination of any discontinuities which may arise due to the presence of the faulty interconnection still connected to the repaired wire. In the figure, the C4 pads are connected to the vias by conductor straps 18 that provide the connection for non-faulty interconnections. The strap is conventionally created by a mask during the fabrication of the TSM and if the interconnection is faulty, a laser delete operation is necessary to disconnect the faulty interconnection from the C4 pad. This operation may produce stubs however, as noted above.

Bearing in mind the problems and deficiencies of the prior art, it is therefore an object of the present invention to provide a method for repairing interconnections and/or making engineering changes in multi-layer thin film containing electronic components such as MCM's.

Another object of the invention is to provide a method for repairing interconnections and/or making EC's in multi-layer thin containing film electronic components employed on top of ceramic, laminate, dielectric or other substrates.

A further object of the invention is to provide a MLTF structure having repair lines and/or EC lines made using the method of the invention.

A still further object of the invention is to provide a multi-chip module containing a MLTF structure having repair lines and/or EC lines made using the method of the invention.

Still other objects and advantages of the invention will in part be obvious and will in part be apparent from the specification.

SUMMARY OF THE INVENTION

The above and other objects, which will be apparent to those skilled in the art, are achieved by the present invention which relates to a method for repairing interconnections in multi-layer thin film (MLTF) structures typically used to make multi-chip modules (MCM) by employing the MLTF structure on MCM's such as MCM-C (ceramic substrate), MCM-D (non-conductive substrate) and MCM-L (laminate substrate) comprising making the MLTF layer by layer up to a layer adjacent the top surface layer, determining the interconnection defects at the thin film layer below and adjacent the top surface layer of the MLTF structure, defining the top surface connections needed to repair the defective interconnections based on the defects uncovered and/or EC's desired, preferably using a computerized algorithm to determine the best metal line routes forming the top surface layer, and then plating the top surface layer to form the top surface metallization and the defined repair lines and/or EC connection lines.

Broadly stated, after the MLTF has been formed to the thin film layer adjacent to and below the TSM layer, electrical testing is performed to determine any faulty interconnections. The interconnection faults may arise due to opens or shorts in the line. Simple capacitance testing or other such testing methods can be used to differentiate between the defective and defect-free interconnections. Once the faulty interconnections are detected, it can be determined if the interconnection is within the chip or a chip to chip connection. It is important to note that any plane opens or power-ground plane short is a fatal defect and cannot be repaired. Next the top surface metallurgy level is built similarly by applying a polyimide or similar dielectric material having defined vias, applying a metal conducting layer, applying a photoresist layer and using, for example, a fixed mask to define the pads, vias and (optionally) conducting straps connecting the pads to the vias. Defective interconnections are preferably isolated so that there is no conductor strap between the pad and corresponding defective via interconnection. Using the determined interconnection data the C4 pads, straps and repair lines needed on the top surface to repair the component are defined and then the surface plated. Typically no additional conductors other than the repair lines are needed after the metallization of the TSM layer has been formed (pads, vias and connecting straps).

Assuming the net to be repaired is a thin film net, a scheme such as a direct write method is used to direct write a line between the appropriate C4 pads on the top surface metallurgy level. These lines are typically 1–2 chip pitches in length in a multichip module. If the net to be repaired is in the substrate (e.g., ceramic) then a line is created using buried ceramic lines as described in U.S. Pat. No. 5,243,140, supra. Typically, for each defect and/or engineering change, the line from the "defective" pad to the repair location, e.g., pad, is a single (individual) conductive line used to repair each defective via or to make each engineering change.

The interconnection defects that can be repaired using this method are tabulated in Table 1.

TABLE 1

| THIN FILM REPAIR TYPES | | REPAIR STRATEGY |
|---|---|---|
| Opens | Signal Line | *DW on Top Surface |
| | Power Via | Not Repairable |
| | Signal Via | DW on Top Surface |
| Intra Level | Signal Line-Signal Via | Shorts Test/DW on Top |

TABLE 1-continued

| THIN FILM REPAIR TYPES | | REPAIR STRATEGY |
|---|---|---|
| Shorts | | Surface |
| | Signal Line-Power Via | Shorts Test/DW on Top Surface |
| | Signal Line-Signal Line | Shorts Test/DW on Top Surface |
| Inter Level | Signal Line X-Y | DW on Top Surface |
| Shorts | Mesh-Cop. Pad | Not Repairable |
| | C4 Pad-Mesh | Not Repairable |

*DW = Direct Write

In another aspect of the invention, the proposed method of the invention can also be used for implementing engineering changes (EC). ECs are required in a product to make changes at the systems level. In this method, ECs can be incorporated by using some of the C4 pads primarily for ECs with an EC wire buried in the substrate and connected to the C4 pad. The repair scheme can be used to disconnect or delete the straps between the via and the C4 pad of the original connection, and direct writing a line to the defined EC C4 pad. EC's are described and shown in U.S. Pat. No. 5,243,140, supra.

In the past, ECs have been a problem due to congestion problems leading to inescapability of the line in the C4 cage. This was because the top surface contained numerous wires in the form of streets and avenues that led to the congestion problems. Since in the method of the invention, a single wire is constructed on the top surface only, if necessary, to correct each defect no congestion problems arise and an EC can be easily implemented.

The method also has significant advantages including that no wiring lines need to be dedicated for repair in the thin film structure. This allows 100% of the lines in the thin film for wiring. Also, no stubs need be created on the repair line which is critical for high performance machines since stubs act as capacitive discontinuities degrading the signal, thus making the nets non-functional. Further, no additional pads are required as in DDEC for the repair. This saves real estate on the top surface of the module which could be used for passive devices such as capacitors, resistors, etc. and no congestion problems arise since a repair wiring line is created only if necessary.

In a further aspect of the invention, MLTF structures including MCM's containing MLTF structures are provided which have only additional top surface wiring needed for repairing defects in the MLTF and/or making EC changes.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
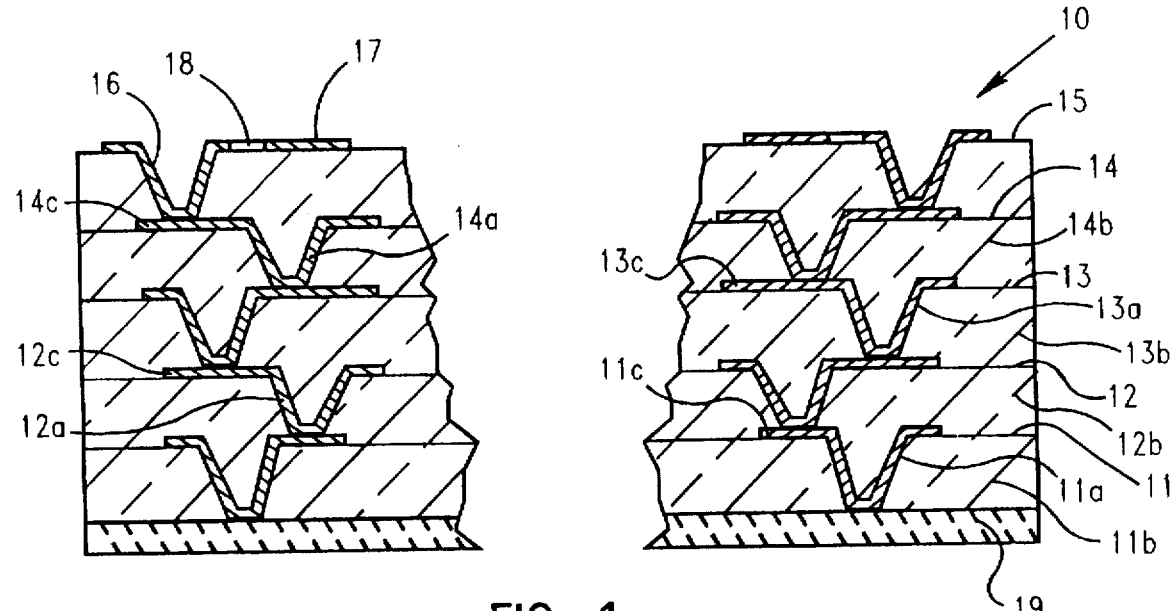
FIG. 1 is a side elevational view of a multi-layer thin film structure electronic component repairable by the method of the present invention.

In describing the preferred embodiment of the present invention, reference will be made herein to FIGS. 1-10 of the drawings in which like numerals refer to like features of the invention. Features of the invention are not necessarily shown to scale in the drawings.

The repair scheme can be used for any MLTF structure having any number of layers. FIG. 1 shows the cross-section of the MLTF structure shown generally as 10 which in this case consists of 5 metal layers (11–14 and 19) and a metal TSM layer 15. The TSM layer would contain features such as the chip connection pads, vias, via-pad connector straps and repair lines. The 5 metal layers are listed below:

Layer 1: Capture Pad (19)
Layer 2: Mesh 1 (11)
Layer 3: X Wiring Level (12)
Layer 4: Y Wiring Level (13)
Layer 5: Mesh 2 (14)

Layers 11–14 comprise vias (11a, 12a, 13a and 14a) in corresponding dielectric layers 11b, 12b, 13b and 14b and metal lines on top of the dielectric and in the vias (11c, 12c, 13c and 14c). Other MLTF wiring not shown is also on each layer as well-known in the art. The pads, straps and vias interconnect layer by layer and form the interconnections terminating on the TSM 15. The top level 15 include vias 16, pads 17 and straps 18. Some of these interconnections may be defective and need to be repaired using the method of the invention.

The repair scheme used is based on the electrical testing and/or inspection for defects at the MLTF layer 14 which is the layer below and adjacent to the top surface layer 15 and the use of metal plating using the test data, preferably using a technique such as direct write technology, on the top surface of the thin film (TSM) 15 to repair the defects and or make EC changes. The Direct Write method may be defined as the use of an algorithm that analyzes the test data and determines the best or most efficient repair layout needed for the TSM level. After the application of conductor layer and photoresist layers, a direct write tool controlled by the algorithm is moved over the TSM 15 typically in an X-Y direction to expose the resist forming the desired repair lines. The Direct Write Method may also be used to define the pads, vias, etc., however, much of this is generally done using a fixed mask due to cost considerations. A Direct Write tool typically comprises an UV or electron beam source, a shutter and condensing lens with a variable aperture and a reduction lens.

Figure 2:
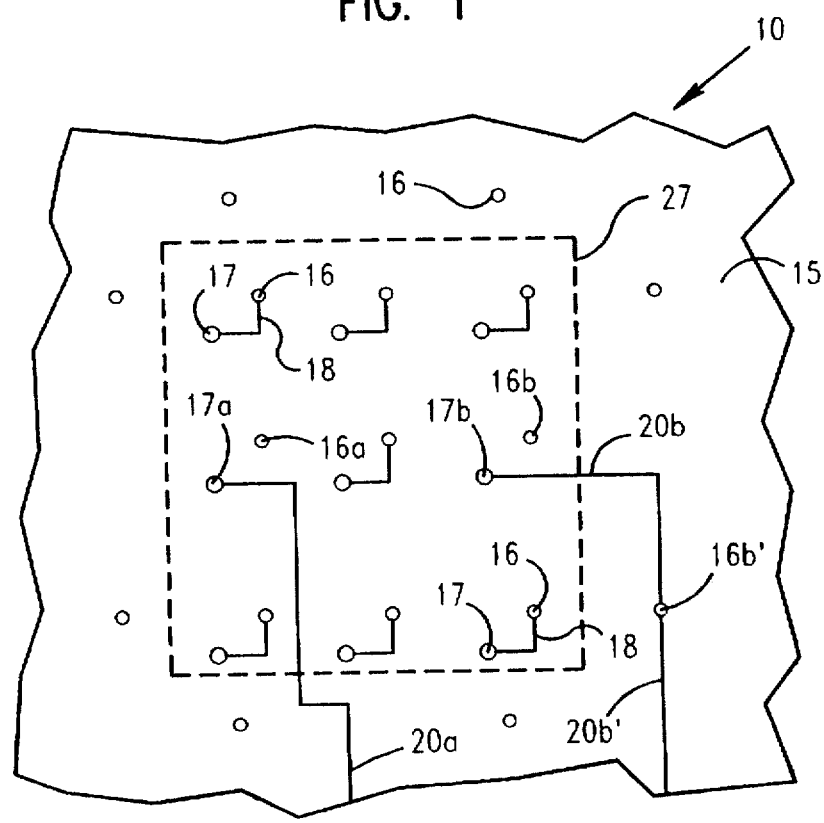
FIG. 2 is a partial top view of a MCM showing the top surface of a MLTF and the repair wiring using the repair method of the invention.

FIG. 2 shows a partial top view of the multi-layer thin film structure of FIG. 1 showing one chip bounded by dotted lines 27 and a typical repair and EC scheme using the method of the invention. Defect-free vias 16 and their corresponding C4 pads 17 that support the C4 balls to connect to the chips are electrically connected by the via connection straps 18 shown as L-shaped. The C4 pads 17 are shown preferably offset from the vias 16 to facilitate deleting a faulty thin film or glass ceramic net by either adding or deleting the straps so that no stubs are connected to the repair lines. Via 16a was detected to be faulty by testing and preferably no strap fabricated for connection to its corresponding pad 17a. If 18a (not shown) connecting pad 17a and via 16a was fabricated it can be deleted by a laser delete technique. Using, for example, the Direct Write procedure, repair strap 20a is shown connected to C4 pad 17a. Strap 20a would terminate at C4 pad 17a' on the TSM layer (not shown) to repair the defective interconnection. Repair strap 20b is shown escaping from pad 17b to a pre-assigned via location 16b' using buried repair lines usually in the substrate on which the MLTF is mounted to repair defective via 16b or make an EC. Strap 20b' would connect with a C4 pad (not shown) to complete the interconnection. Again, strap 18b (not shown) connecting pad 17b and via 16b can be deleted or not fabricated.

In general the repair method comprises a series of steps as follows:

1. As shown in FIG. 1, build the layers of thin film 11, 12, 13 and 14 on capture level 19 which includes wiring patterns such as pads, straps, vias, etc. and preferably test for opens and shorts at each layer before the next layer is built. Typically each layer is made as follows. A dielectric material layer 11b such as polyimide or epoxy is applied and a via 11a defined for further interconnection. A seed plating layer is applied on top thereof and photoresist material then applied and exposed to define the wiring pattern. After developing, a metal such as copper is electroplated to form the wiring shown as 11c. The photoresist material and seed layer is then stripped. This is generally termed a lithography or photolithography process and may be used for additive or subtractive metallization procedures as is well-known in the art, e.g., as described in U.S. Pat. No. 5,258,236, which is incorporated herein by reference. This procedure is continued for each layer until the thin film structure is completed. Intralevel shorts/opens at each layer may be repaired using existing tools. Any plating method can be used, for example, either an additive or subtractive method as is known in the art.

2. After building the 5 layer structure, the Mesh 2 level 14 (FIG. 1) is tested to establish any interconnection defects, e.g., signal line/via opens/shorts. The nets that need to be repaired are determined and if the nets are thin film or ceramic (substrate) nets.

3. Build the top surface layer 15 as for the other layers preferably using a fixed mask and expose with C4 pads at every via location. Connector straps are preferably not built for defective via interconnections, however, this is not the most cost effective method and it is preferred to use a fixed mask and to build the straps and then to delete the straps for defective vias or EC's.

4. Based on the data obtained define the C4 pads and vias needing repair and selectively expose the conductor straps (repair lines) needed to repair the MLTF component or make EC's. For example, as shown in FIG. 2, existing pads 17a and 17b and defined repair lines 20a and 20b and 20b' are used to repair or make EC's for defective or unneeded vias 16a and 16b. The repair lines 20a and 20b and 20b' are defined in the following way:

a: If the net to be repaired is a thin film net, then direct write a line between the corresponding C4 pads on the top surface 15. These lines are typically 1–2 chip pitches in length. With reference to FIG. 2 such a repair is shown using pad 17a and strap 20a to connect to pad 17a' (not shown).

b: If the net to be repaired is a substrate ceramic net, then direct write a line to a specified via location, usually outside the chip area (shown by bounded lines 27), and create a stitch pattern using buried ceramic lines. This is shown in FIG. 2, whereat pad 17b is connected by strap 20b to via 16b'. Strap 20b' connects to pad 17b' (not shown)

Figure 3:
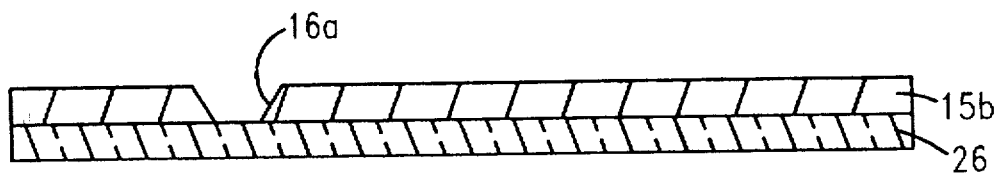
FIGS. 3–10 are side elevational views showing a sequence of steps which may be used to repair a multi-layer thin film structure by the method of the invention.

With regard to FIGS. 3–10, the repair method of the invention may be demonstrated for an additive metal plating process. In FIG. 3 the multi-layer thin film substrate of FIG.

Figure 4:
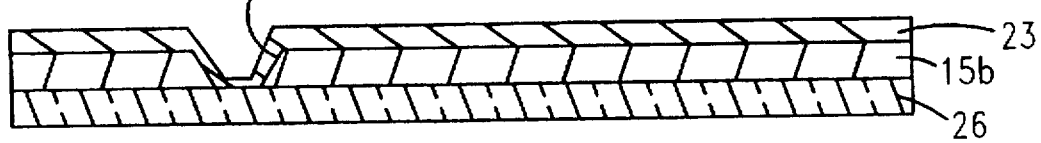
Figure 5:
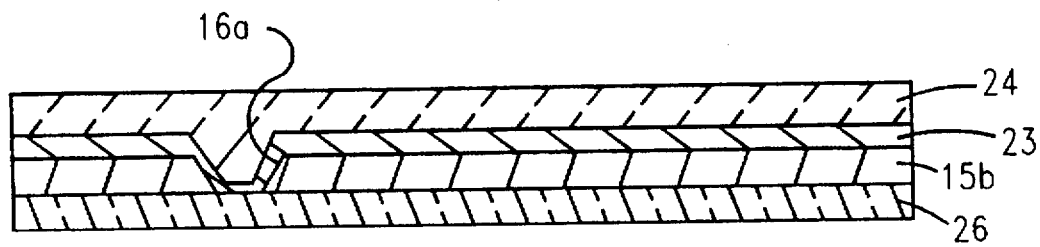
Figure 6:
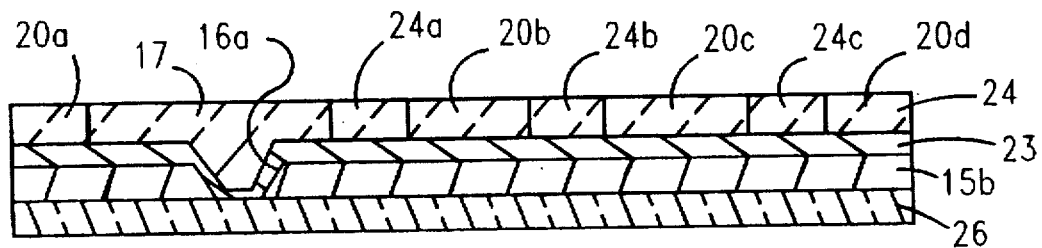
Figure 7:
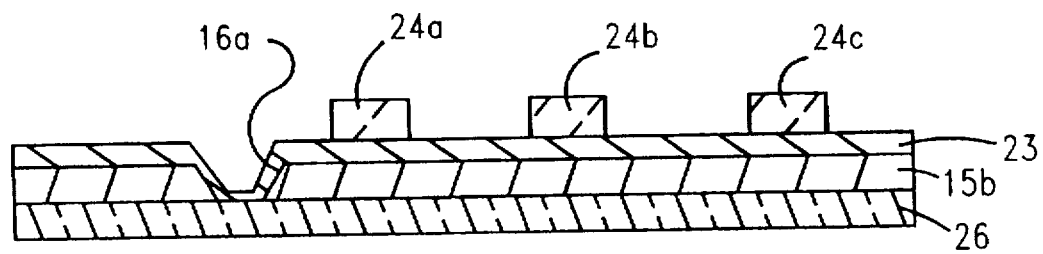

1 is shown schematically completed to the mesh 2 level 14 and is shown in composite as 26. Substrate 26 is then overcoated with a dielectric material such as polyimide layer 15b and via 16a defined by laser ablation or photolithography. Via 16a is shown as a via requiring repair. In FIG. 4, a thin metallic plating conductor layer 23 such as Cr/Cu at 2500 Å is applied to the dielectric layer 15b and via 16a. FIG. 5 shows the application of a thick positive photoresist material 24 to the metal layer 23. FIG. 6 shows the use of preferably a direct write tool using the data determined from the test described above to expose and define development repair lines 20a, 20b, 20c and 20d and non-developable resist areas 24a, 24b and 24c. The fixed structures, i.e., chip connecting pads 17, via pads 16 and strap lines 18 (not shown) are preferably exposed through a mask and developed at the same time as areas 20 and 24. The photoresist 24 is a positive photoresist and as shown in FIG. 7 when it is developed it leaves positive images 24a, 24b and 24c on the surface 23. Thus, 24a, 24b and 24c indicate areas on the top surface 15 of the electronic component that are not to be plated.

Figure 8:
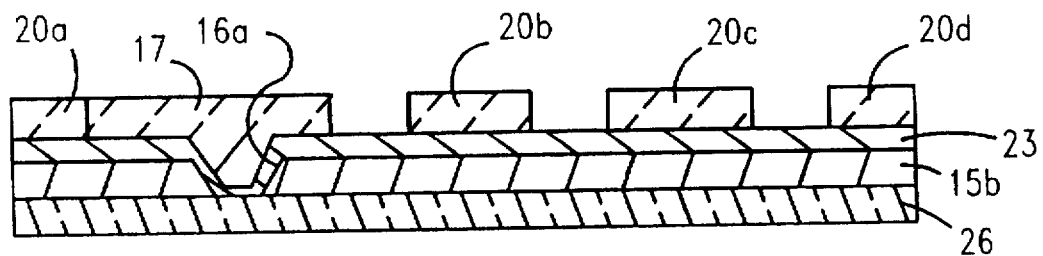
Figure 9:
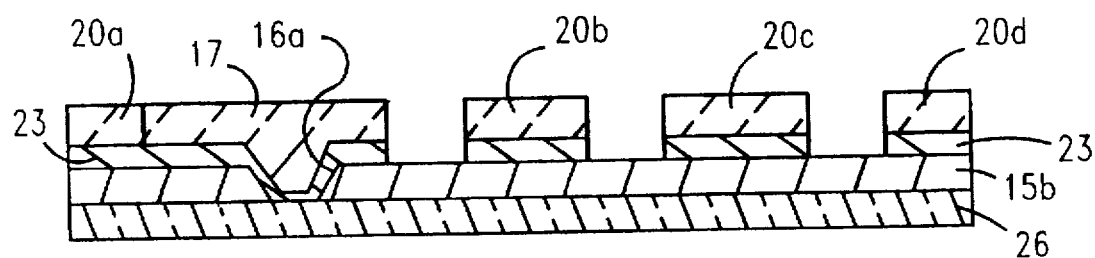
Figure 10:
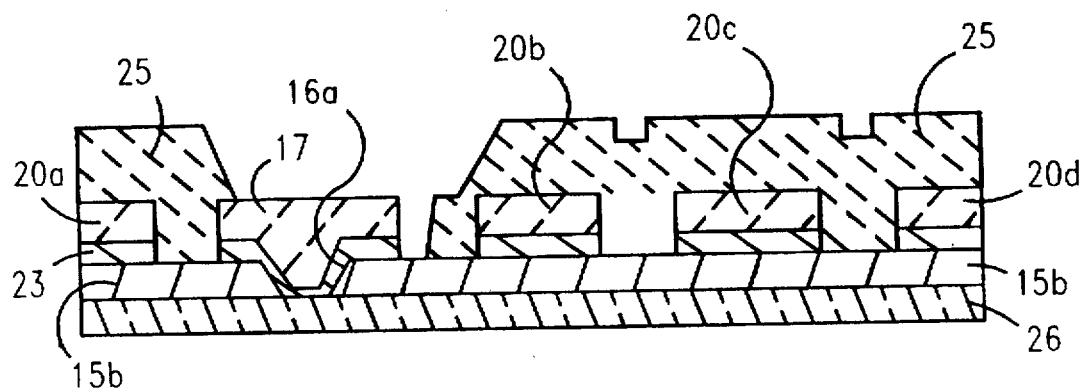

FIG. 8 shows the substrate shown in FIG. 7 after metal plating (such as copper) followed by stripping of the photoresist areas 24a, 24b and 24c. As shown in FIG. 8, conductor areas 20a, 20b, 20c and 20d and pad 17 are formed on the top surface of the structure. In FIG. 9 the plating conductor layer 23 has been etched from the unprotected areas leaving a conductor layer 23 under each of the repair lines 20a, 20b, 20c and 20d and pad 17. FIG. 10 shows the application of a photoimaginable overcoat layer 25 on the structure of FIG. 9 covering the repair lines and part of pad 17. The completed repaired substrate is then typically cured and ashed and is now ready for chip attachment.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method for repairing interconnections of multi-layer thin film structures or making engineering changes to the structures which structures comprise a series of layers comprising a dielectric having plated metal thereon in the form of wiring and via interconnections to the next layer and a top layer of the structure which has interconnecting vias to the lower layers and corresponding chip connection pads comprising the steps of:

building the multi-layer thin film structure layer by layer up to a layer adjacent to the top layer;

testing and/or inspecting the layer adjacent the top layer to determine interconnection faults in the multi-layer thin film structure;

forming the top layer comprising a dielectric and defining, vias, pads and via-pad connecting lines metallization;

depending on the defects determined in the multi-layer thin film structure obtained by testing the layer adjacent the top layer, defining the repair lines on the top surface needed to cure the defects and/or make engineering changes; and forming the metallization and repair lines on the top surface to cure the defects and/or make engineering changes.

2. The method of claim 1 wherein the repair lines are defined using a direct write tool controlled by an algorithm that analyzes the test data and determines the repair wiring needed for the multi-layer thin film structure.

3. The method of claim 2 wherein the metallization and repair lines are formed on the top dielectric layer by applying a layer of metal, applying a layer of photoresist, using the direct write tool to define the repair lines by exposing the resist layer based on an algorithm using the data obtained, developing the resist, plating the developed structure, and stripping the resist and metal layer.

4. The method of claim 1 wherein the top surface metallization is formed using a fixed mask.

5. The method of claim 1 wherein each thin film layer is tested and/or inspected after its fabrication to determine intralevel defects and repairing any such defects before the next layer is formed.

6. A method of forming a multi-layer thin film structure which comprises a series of layers comprising a dielectric having metal thereon in the form of wiring and via interconnections and a top surface layer of the structure which has vias, chip connection pads and via pad connection straps and defined metal repair lines thereon comprising the steps of:

building a multi-layer thin film structure, having a top surface metal layer, layer by layer up to a layer adjacent to the top surface metal layer of the structure;

electrically testing and/or inspecting the layer adjacent to the top surface metal layer and determining faulty interconnections;

determining the best metal line routes to repair faulty interconnections and/or making engineering changes;

building the top surface layer and defining the metal repair lines thereon; and forming vias, via connection straps, chip connection pads and metal repair and/or engineering change lines on the top surface layer.

7. The method of claim 6 wherein the metal repair and/or engineering change lines are defined by a direct write exposure tool controlled by an algorithm that analyzes the test data and determines the repair and/or engineering change wiring needed.

8. The method of claim 7 wherein the via connection straps and repair and/or engineering change lines are defined by a direct write exposure tool controlled by an algorithm that analyzes the test data and determines the connection straps, repair and/or engineering change wiring needed and does not need a strap line deletion operation.

9. The method of claim 6 wherein the structure is repaired and/or engineering change are made without adding any additional conductors after the top surface metal layer has been formed.

10. The method of claim 6 wherein the top surface metal features are formed using subtractive or additive metallization techniques.

* * * * *